United States Patent [19]
Grandmont

[11] 4,403,196
[45] Sep. 6, 1983

[54] PULSE WIDTH MODULATED POWER AMPLIFIER WITH DIFFERENTIAL CONNECTING LINE VOLTAGE DROP COMPARATORS

[75] Inventor: Paul E. Grandmont, Bloomfield, N.J.

[73] Assignee: The United States of America as represented by the Secretary of the Air Force, Washington, D.C.

[21] Appl. No.: 256,373

[22] Filed: Apr. 22, 1981

[51] Int. Cl.³ .............................................. H03F 3/38
[52] U.S. Cl. ...................................... 330/10; 330/85; 330/286
[58] Field of Search ................. 330/10, 53, 85, 207 A, 330/251, 286; 323/282, 285, 288; 363/26, 65

[56] References Cited
U.S. PATENT DOCUMENTS

| | | | |
|---|---|---|---|
| 2,961,597 | 11/1960 | Carleton | 323/78 |
| 3,295,052 | 12/1966 | Martin | 323/22 |
| 3,303,412 | 2/1967 | Gately | 323/4 |
| 3,408,559 | 10/1968 | Bambace et al. | 323/22 |
| 4,038,593 | 7/1977 | Quinn | 323/4 |
| 4,186,437 | 1/1980 | Cuk | 363/65 |

*Primary Examiner*—James B. Mullins
*Attorney, Agent, or Firm*—Donald J. Singer; Willard R. Matthews

[57] ABSTRACT

The adverse effects of the impedance of long varying impedance connecting lines used in pulse width modulated power amplifier are eliminated by means of a dual input differential amplifier that senses the line voltage drops in the connecting lines and combines them into a line voltage drop compensation signal that is applied across the power amplifier inputs. This line voltage drop compensation signal raises the output of the power amplifier by the amounts needed to null out the line voltage drops.

5 Claims, 1 Drawing Figure

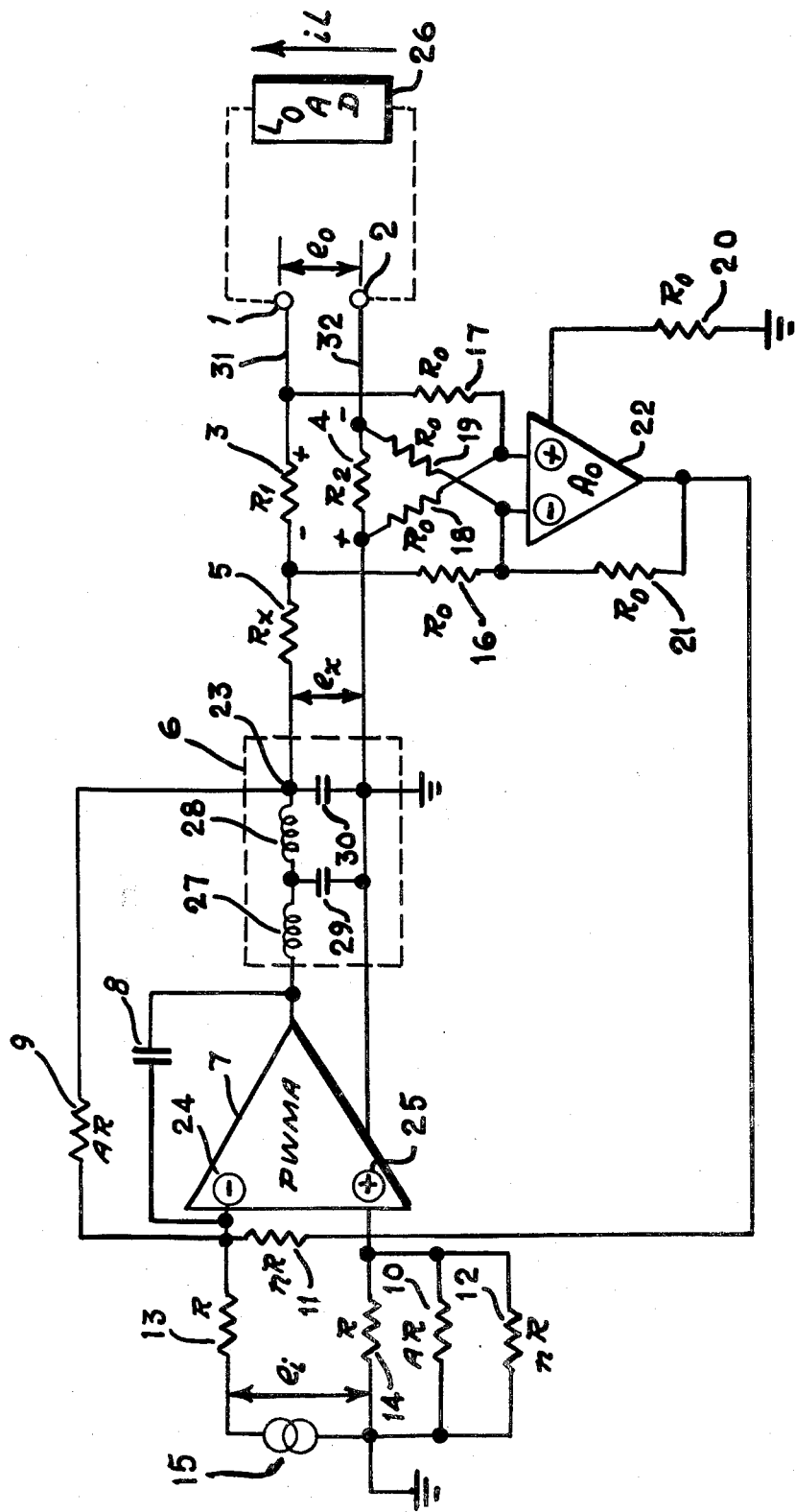

PULSE WIDTH MODULATED POWER AMPLIFIER WITH DIFFERENTIAL CONNECTING LINE VOLTAGE DROP COMPARATORS

STATEMENT OF GOVERNMENT INTEREST

The invention described herein may be manufactured and used by or for the Government for governmental purposes without the payment of any royalty thereon.

BACKGROUND OF THE INVENTION

This invention relates to connecting line voltage drop compensating circuits and in particular to the application of a dual input differential amplifier to cancellation of line voltage drops in pulse width modulated power amplifier circuits.

Circuits of the type to which the invention applies generally consist of a power amplifier fed from a power source and feeding output terminals to which a load is connected. Long variable impedance connecting lines connect the amplifier to the output terminals. Such circuits are subject to the adverse effects of the impedance of the long varying impedance connecting lines from the source impedance "seen" at the terminals to the load.

The state-of-the-art approach to eliminating these adverse effects is to have a very high gain feedback loop enclose the connecting line resistances. The magnitude of these resistances as seen by the load is then, by classic theory, divided by the magnitude of the loop gain and reduced in inverse proportion to this value.

The basic disadvantage of this method is that if a very low-source impedance ($-\partial e_o/\partial i_L$) is desired and connecting line resistances are much higher than the required value, the required "loop gain" must be quite high. Then if the desired impedance must remain low at fairly high frequencies serious feedback loop stability problems easily arise and preclude the effective use of this method.

This situation is particularly serious in the case of modern "pulse width modulated" amplifiers. These use alternating polarity "switched" pulses with pulses of the desired output polarity lengthened and their opposites shortened to produce a required output. The frequency of alternation of these pulses must be much higher than the highest required output-signal frequency, with the undesired high frequencies being removed by a filter at the output.

In this scheme control of high-frequency interference usually requires that the filter be close to its source and since the filter cutoff requirements make it impossible to make it an element of a wide-band, high-gain feedback loop feedback loop gain including the filter is limited.

Accordingly there currently exists the need for a connecting line voltage drop compensator for use in pulse width modulated amplifier and similar circuitry that is not subject to the limitations described. The present invention is directed toward satisfying that need.

SUMMARY OF THE INVENTION

The invention is a pulse width modulated power amplifier having output connecting line voltage drop compensation. The pulse width modulated power amplifier consists of a power amplifier having positive and negative inputs and two outputs, a high frequency filter, output terminals and connecting lines connecting the power amplifier and filter to the output terminals. The power amplifier also has a feedback circuit including a feedback resistor connected to its negative input and is fed from a conventional power supply. Connecting line voltage drop compensation is provided by a dual input differential amplifier with two pairs of inputs that sense the voltage drops across the line resistance of the connecting lines and combines these voltage drops into an input to the power amplifier that effects a raise in the power amplifier output sufficient to null out the line voltage drops.

It is a principal object of the invention to provide a new and improved pulse width modulated power amplifier circuit.

It is another object of the invention to provide a new and improved connecting line voltage drop compensator for pulse width modulated power amplifiers and similar circuits.

It is another object of the invention to provide a line voltage drop compensator of the type described that is not subject to oscillation.

It is another object of the invention to provide a line voltage drop compensator of the type described that will provide a stable negative value of output impedance.

These, together with other objects, features and advantages of the invention will become more readily apparent from the following detailed description when taken in conjunction with the illustrative embodiment in the accompanying drawing.

DESCRIPTION OF THE DRAWING

The sole FIGURE of the Drawing is a schematic of the preferred embodiment of the invention.

DETAILED DESCRIPTION OF THE PREFERRED EMBODIMENT

A schematic diagram of the pulse width modulated power amplifier with differential connecting line voltage drop compensation comprehended by the invention is shown in the sole FIGURE of the drawing. Referring thereto the pulse width modulated power amplifier comprises power amplifier 7 fed from power supply 15 through resistors 13, 14, high frequency filter 6 consisting of inductors 27, 28 and capacitors 29, 30 and connecting lines 31, 32 that terminate in output terminals 1, 2. Power amplifier 7 has a first feedback through capacitor 8 and a second feedback through resistor 9. A load 26 is applied to output terminals 1, 2. The connecting line voltage drop compensator comprises differential amplifier 22 and resistors 10, 11, 12, and 16 through 21 arranged in the circuit configuration shown.

The load device 26 being connected to the line terminals 1 and 2 receives the voltage $e_o$ and draws the curent $i_L$. The source impedance seen by this load is then the value of:

$-\partial e_o/\partial i_L$ (the rate of decrease of $e_o$ with increase in $i_L$)

As noted above, this value is affected by the magnitude of the connecting line resistances 3 and 4 and by the resistance 5 (equivalent impedance of filter 6 and amplifier 7). The circuits of the invention as herein described eliminates the effects of these resistances.

The method of the invention used to overcome these effects involves the use of an amplifier 22. This amplifier is connected as an "orthodox" differential amplifier. It receives two inputs. One input is the line voltage drop across connecting line resistance 3, received via resistors 16 and 17. The other input is the line voltage drop across connecting line resistance 4 received via resistors 18 and 19. With feedback resistor 21 and "ground" resistor 20 of the same value as resistors 16 thru 19 and with the circuit connections as shown, the output of differential amplifier 22 is the "vector sum" of the line voltage drops across connecting line resistances 3 and 4. When the two terminals of this output are connected to the differential input of power amplifier 7 via resistors 12 and 11, the output at junction 23 is raised proportionately. If resistors 10 and 12 and also 11 and 9 are equal, the proportionality factor is 1.0. The increase in the output at junction 23 is then equal and opposite to the line voltage drops across connecting line resistances 3 and 4 and the output between output terminals 1 and 2 becomes independent of connecting line resistances 3 and 4.

Since the operation of the invention consists essentially in a mathematical subtraction of voltage values, it is best described by appropriate equations. Referring to the symbols shown in the FIGURE and noting that power amplifier input terminal 25 will be at ground and that the high gain of power amplifier 7 will cause its input to be negligible and therefore also place negative input terminal 24 at ground, it can be stated (by Kirkoff's current law)

$$\frac{e_i}{R} - \frac{e_x}{AR} + \frac{i(R_1 + R_2)}{MR} \cong 0 \qquad (1)$$

Also by Kirkoff's voltage law at the output:

$$e_x = e_o + i(R_1 + R_2) - i_L R_x \qquad (2)$$

Substituting equation (2) in equation (1) and rearranging:

$$\frac{e_i}{R} - \frac{e_o}{AR} - i_L \frac{R_1 + R_2}{AR} + i_L \frac{R_1 - R_2}{MR} - \frac{i_L R_x}{AR} = 0 \qquad (3)$$

$$e_o = A e_i - i_L (R_1 + R_2) \left(1 - \frac{A}{\eta}\right) - i_L R_x \qquad (4)$$

$$-\frac{\partial e_o}{\partial i_L} = (R_1 + R_2)\left(1 - \frac{F}{\eta}\right) + R_x \qquad (5)$$

It is seen that if resistor values are chosen to give $\eta = A$, the terms in $(R_1 + R_2)$ vanish. The output voltage $e_o$ and source impedance $-\partial e_o/\partial i_L$ then are in independent of line voltage drop.

It is noted that with high gain $A_o$ in differential amplifier 22, 0 table gain from power amplifier 7 and stable and accurate amplifier input and feedback resistors, the $\eta = A$ relation noted above is readily effected and maintained to a high accuracy. This is done more easily than the accomplishment of the high loop gain of the classic "feedback" method, and with no risk of oscillation.

Also, in cases where the values of connecting line resistances of $R_1$, $R_2$ and $R_x$ in equation (5) are stable, the value of $A/\eta$ can be selected to make the bracket factor negative and of such magnitude as to give $-\partial e_o/\partial i_L = 0$, which is never possible by the present feedback method.

In fact, in the present case, it is a practical possibility to produce a stable negative value of output impedance, which can be useful in many cases (e.g. to "null out" the effect of an indesired resistance in the load device).

In the foregoing description, the implicit assumption is made that there are no phase shifts present. In practice the need to limit high frequency transmission and the normal limitation of amplifier performance will lead to some phase shifts. The values A and $\eta$ in equations (4) and (5) are then complex ratios. Resistors 20, 21 and 11 then can become complex impedances, and the equality of A and $\eta$ involves matching phase angles as well as magnitudes. But since the substitution of couplex values makes no formal change in the general equations and since the adjustment of phase, as well as magnitude relations, is a known art, the design details involved are not essential to the novel aspects of the circuit of the invention described above.

While the invention has been described in its preferred embodiment, it is understood that the words which have been used are words of description rather than words of limitation and that changes within the purview of the appended claims may be made without departing from the scope and spirit of the invention in its broader aspects.

What is claimed is:

1. In a pulse width modulated power amplifier circuit having a power amplifier with positive and negative inputs and first and second outputs, said inputs connected to a grounded power source, filter means connected to said first and second power amplifier outputs, a first connecting line having a line resistance $R_1$ and a second connecting line having a line resistance $R_2$ each connected between said filter means and an output terminal, and a power amplifier feedback having a feedback resistor connected between an output of said filter means and the negative power amplifier input, the improvement residing in a connecting line voltage drop compensator, said connecting line voltage drop compensator comprising:

dual input differential amplifier means having inputs sensing the line voltage drop across resistor $R_1$ of said first connecting line, and inputs sensing the line voltage drop across resistance $R_2$ of said second connecting line, the output of said differential amplifier means being applied across the inputs of said power amplifier.

2. In a pulse width modulated power amplifier, a connecting line voltage drop compensator as defined in claim 1 wherein said differential amplifier means comprises:

a differential amplifier having a positive input and a negative input and an output, a first resistor connected between the differential amplifier negative input and the filter end of said first connecting line, a second resistor connected between the differential amplifier positive input and the output terminal end of said first connecting line, a third resistor connected between the differential amplifier negative input and the output end of said second connecting line, a fourth resistor connected between the differential amplifier positive input and the filter end of said second connecting line, a fifth resistor connected between the differential amplifier positive input and ground, a sixth resistor connected between the differential amplifier negative input and the differential amplifier output, a seventh resistor connected between the differential amplifier output and the power amplifier negative input, and eighth and ninth resistors connected between the grounded side of said power source and the power amplifier positive input.

3. In a pulse width modulated power amplifier, a connecting line voltage drop compensator as defined in claim 2 wherein said first, second, third, fourth, fifth and sixth resistors are equal, said seventh and ninth resistors are equal and said eight resistor and said power amplifier feedback resistors are equal.

4. A pulse width modulated power amplifier circuit comprising a power amplifier having a positive input and negative input and first and second outputs, a power supply, the negative input of said power amplifier connected to said power supply through a first resistor and the positive input of said power amplifier connected to said power supply and ground through a second resistor, third and fourth resistors connected in parallel with said second resistor, a first capacitor connected between the negative input of said power amplifier and its first output, first and second inductors connected in series to the first output of said power amplifier, first and second output terminals, a first connecting line having a resistance $R_1$ connected between said second inductor and said first output terminal a second connecting line having a resistance $R_2$ connected between the second power amplifier output and said second output terminal, a second capacitor connected between the junction of said first and second inductors and said second connecting line, a third capacitor connected between said first and second connecting lines between said second inductor and said output terminals, the junction of said third capacitor and said second connecting line being grounded, a feedback resistor connected between the negative input of said power amplifier and the junction of said third capacitor and said first connecting line, a differential amplifier having a positive input and a negative input and an output, a fifth resistor connected between the differential amplifier negative input and the power amplifier end of said first connecting line, a sixth resistor connected between the differential amplifier positive input and the output terminal end of said first connecting line, a seventh resistor connected between the differential amplifier negative input and the output end of said second connecting line, an eighth resistor connected between the differential amplifier positive input and the filter end of said second connecting line, a ninth resistor connected between the differential amplifier positive input and ground, a tenth resistor connected between the differential amplifier negative input and the differential amplifier output, an eleventh resistor connected between the differential amplifier output and the power amplifier negative input.

5. A pulse width modulated power amplifier circuit as defined in claim 4 wherein said fifth, sixth, seventh, eighth, ninth and tenth resistors are equal, said fourth and eleventh resistors are equal and said third resistor and said power amplifier feedback resistor are equal.

* * * * *